(12) United States Patent
Yang

(10) Patent No.: US 11,508,839 B2
(45) Date of Patent: Nov. 22, 2022

(54) HIGH ELECTRON MOBILITY TRANSISTOR WITH TRENCH ISOLATION STRUCTURE CAPABLE OF APPLYING STRESS AND METHOD OF MANUFACTURING THE SAME

(71) Applicant: UNITED MICROELECTRONICS CORP., Hsin-Chu (TW)

(72) Inventor: Po-Yu Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/315,380

(22) Filed: May 10, 2021

(65) Prior Publication Data

US 2021/0280706 A1 Sep. 9, 2021

Related U.S. Application Data

(62) Division of application No. 16/527,042, filed on Jul. 31, 2019, now Pat. No. 11,038,046.

(30) Foreign Application Priority Data

Jul. 10, 2019 (CN) .......................... 201910618705.2

(51) Int. Cl.
*H01L 29/778* (2006.01)
*H01L 21/762* (2006.01)
*H01L 29/20* (2006.01)
*H01L 29/66* (2006.01)

(52) U.S. Cl.
CPC .... *H01L 29/7786* (2013.01); *H01L 21/76224* (2013.01); *H01L 29/2003* (2013.01); *H01L 29/66462* (2013.01)

(58) Field of Classification Search
CPC .................................................. H01L 29/7786
USPC .......................................... 438/285; 257/194
See application file for complete search history.

(56) References Cited

U.S. PATENT DOCUMENTS

| 8,981,488 B1* | 3/2015 | Wen ............... H01L 21/823481 |
| | | 257/373 |
| 9,136,321 B1* | 9/2015 | Narasimha .......... H01L 27/1203 |
| 2012/0153300 A1 | 6/2012 | Lidow |
| 2014/0091310 A1 | 4/2014 | Jeon |
| 2014/0264449 A1* | 9/2014 | Parsey, Jr. ........... H01L 29/0649 |
| | | 257/194 |

(Continued)

FOREIGN PATENT DOCUMENTS

| CN | 106257686 A | 12/2016 |
| EP | 2 339 635 A2 | 6/2011 |

(Continued)

*Primary Examiner* — Ajay Arora
(74) *Attorney, Agent, or Firm* — Winston Hsu

(57) ABSTRACT

A method of fabricating high electron mobility transistor, including the steps of providing a substrate with active areas, forming a buffer layer, a channel layer and a barrier layer sequentially on the substrate and gate, source and drain on the barrier layer, forming a trench surrounding the channel layer and the barrier layer, and forming a trench isolation structure in the trench, wherein the trench isolation structure applies stress on the channel layer and the barrier layer and modify two-dimension electron gas (2DEG) or two-dimension hole gas (2DHG) of the high electron mobility transistor.

6 Claims, 7 Drawing Sheets

(56) References Cited

U.S. PATENT DOCUMENTS

2017/0186860 A1 6/2017 Wong
2017/0229480 A1 8/2017 Jin

FOREIGN PATENT DOCUMENTS

EP 2 339 635 A3 7/2013
WO 2018004660 1/2018

* cited by examiner

HIGH ELECTRON MOBILITY TRANSISTOR WITH TRENCH ISOLATION STRUCTURE CAPABLE OF APPLYING STRESS AND METHOD OF MANUFACTURING THE SAME

CROSS REFERENCE TO RELATED APPLICATIONS

This application is a divisional of application Ser. No. 16/527,042, filed on Jul. 31, 2019 and entitled "HIGH ELECTRON MOBILITY TRANSISTOR AND METHOD OF MANUFACTURING THE SAME", which is incorporated herein by reference.

BACKGROUND OF THE INVENTION

1. Field of the Invention

The present invention generally relates to a high electron mobility transistor (HEMT), and more specifically, to a high electron mobility transistor with trench isolation structure capable of applying stress.

2. Description of the Prior Art

With the recent upsurge of the wireless communication market, as well as the steady but continuous progress of power applications, microwave transistors are playing critical roles in many aspects of human activities. The requirements for the performance of microwave transistors are becoming more and more demanding. In the personal mobile communication applications, next generation cell phones require wider bandwidth and improved efficiency. The same requirement holds for broadband wireless internet connections as well because of the ever increasing speed or data transmission rate. Because of these needs, there has been significant investment in the development of high performance microwave transistors and amplifiers based on semiconductor materials such as Si/SiGe, GaAs, SiC, with both the characteristics of large breakdown voltage and high electron velocity.

Among them, the ability of GaN to form heterojunctions makes it a superior material to be used to fabricate high electron mobility transistors (HEMT). The advantages of HEMT include its high carrier concentration and its higher electron mobility due to reduced ionized impurity scattering. The combination of high carrier concentration and high electron mobility results in the characteristics of high current density and low channel resistance, which are especially important for high frequency operation and power switching applications.

In the depletion mode (D-mode) of high electron mobility transistor, the electric field generated by gate electrode is used to deplete a two dimensional electron gas (2DEG) channel at interface of wide energy band gap and narrow energy band gap of semiconductor, such as an interface between AlN/GaN or between AlGaN/GaN. A control voltage can be applied to the gate electrode to directly affect and control the amount of current flowing through the channel. The depletion mode transistors function as "normally-on" devices when used as switches. For an HEMT in enhancement mode (E-mode), no channel is present and no current flow occurs until the transistor is biased for operation. In particular, the transistor is biased and a voltage is applied to the gate electrode in order to move the 2DEG channel below the Fermi level. Once another voltage is applied between the source and drain, the electrons in the 2DEG channel would move from source to drain. The enhancement mode transistors are generally used in digital and analog integrated circuits (ICs) and can function as "normally-off" devices. Enhancement mode HEMTs are also useful for analog circuit applications, such as RF/microwave power amplifiers or switches.

Current research in AlGaN/GaN HEMTs shows promise for high power and high temperature applications. In addition, for applications using transistors as switches or high temperature capable integrated circuits, it is also desirable to have devices in normally-off or enhancement mode operation. Accordingly, there still have a need in the art for improved methods and structures for devices capable of performing in high power, high voltage, high speed, and/or high temperature applications.

SUMMARY OF THE INVENTION

In the light of current demands for high electron mobility transistors (HEMT) in normally-off or enhancement mode operation, the present invention hereby provides a novel high electron mobility transistor structure, with the characteristics of trench isolation structure capable of providing stress to change the concentration of two dimensional electron gas (2DEG) or two dimensional hole gas (2DHG), thereby achieving the effect of adjusting the threshold voltage of devices.

One aspect of the present invention is to provide a high electron mobility transistor structure, including at least one high electron mobility transistor, wherein each high electron mobility transistor includes a substrate with active areas, a buffer layer on the active area, a channel layer on the buffer layer, a barrier layer on the channel layer, and gate, source and drain on the barrier layer, and a trench isolation structure adjacent and surrounding the channel layer and the barrier layer to apply stress on the channel layer and the barrier layer and change two-dimension electron gas (2DEG) or two-dimension hole gas (2DHG) of the high electron mobility transistor.

Another aspect of the present invention is to provide a method of fabricating high electron mobility transistor, including the steps of providing a substrate with active areas, forming a buffer layer, a channel layer and a barrier layer sequentially on the substrate and gate, source and drain on the barrier layer, forming a trench surrounding the channel layer and the barrier layer, and forming a trench isolation structure in the trench, wherein the trench isolation structure applies stress on the channel layer and the barrier layer and modify two-dimension electron gas (2DEG) or two-dimension hole gas (2DHG) of the high electron mobility transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
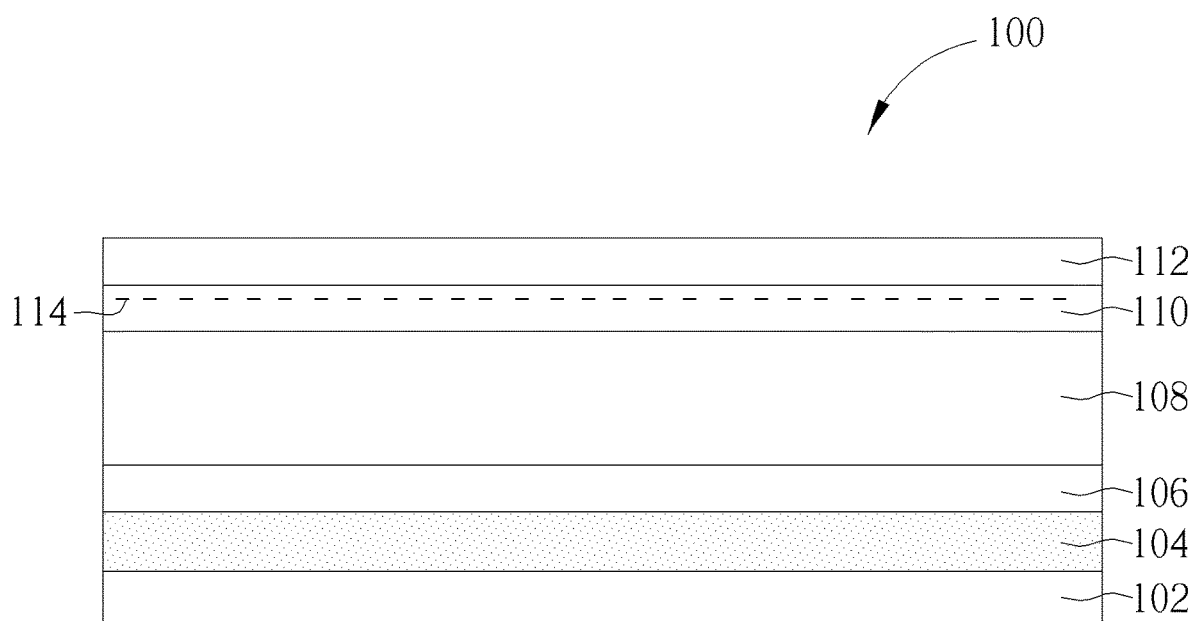
FIGS. 1-4 are schematic cross-sections illustrating the steps of fabricating a high electron mobility transistor in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. The absolute and relative sizes of the components are presented in an exaggeration manner.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a high electron mobility transistor (HEMT) and method for fabricating the same are provided. FIGS. 1-4 show cross-sectional representations of various stages of fabricating a high electron mobility transistor 100 in accordance with some embodiments of the disclosure. The high electron mobility transistor 100 is a field effect transistor incorporating a junction between two materials with different band gaps (i.e., a heterojunction) as the channel instead of using a doped region as the channel, as is generally the case for metal oxide semiconductor field effect transistors (MOSFETs).

Please refer to FIG. 1. First, a substrate 102 is provided. The substrate 102 may be made of silicon (Si) or other semiconductor materials. In some embodiments, the substrate 102 is a silicon wafer. In some embodiments, the substrate 102 is a silicon substrate having <100> lattice structure. An insulating layer 104 is formed on the substrate 102. The insulating layer 104 may be a silicon oxide layer, to reduce parasitic capacitance of overlying devices. A semiconductor layer 106 is formed on the insulating layer 104. In some embodiment, the semiconductor layer 106 is a silicon layer having <111> lattice structure. The Si <111> layer provides an optimal lattice matching with overlying layers, such as a gallium nitride (GaN) layer. In some embodiments, the semiconductor layer 106 is made of a compound semiconductor such as silicon carbide (SiC), gallium arsenic (GaAs), indium arsenide (InAs), or indium phosphide (InP). In some embodiments, the semiconductor layer 106 is made of an alloy semiconductor such as silicon germanium, silicon germanium carbide, gallium arsenic phosphide, or gallium indium phosphide.

Next, refer again to FIG. 1. A buffer layer 108 is formed over the semiconductor layer 106, in accordance with some embodiments of the disclosure. The buffer layer 108 is configured to define a high resistivity layer for increasing the breakdown voltage of the high electron mobility transistor 100. The buffer layer 108 has a resistivity higher than a resistivity of the channel layer to be formed in later process.

In some embodiments, the buffer layer 108 includes one or more Group III-V compound layer. Examples of Group III-V compound layers include, but are not limited to, gallium nitride (GaN), aluminum gallium nitride (AlGaN), indium gallium nitride (InGaN) and indium aluminum gallium nitride (InAlGaN). In some embodiments, the buffer layer 108 includes a dopant to achieve a predetermined high resistivity. In some embodiments, the dopant is a p-type dopant. In some embodiments, the buffer layer 108 includes GaN doped with the p-type dopant. Examples of the p-type dopant include, but are not limited to, carbon (C), iron (Fe), magnesium (Mg) or zinc (Zn). In some embodiment, the buffer layer 108 is formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process.

In addition, before the buffer layer 108 is formed, a nucleation layer and a transition layer (not shown) may be formed sequentially on the semiconductor layer 106. The nucleation layer is used to compensate for the mismatch in lattice structures and/or in coefficient of thermal expansion between the semiconductor layer 106 and the overlying layer. In some embodiments, the nucleation layer includes a step-wise change in lattice structure. The material of nucleation layer may include aluminum nitride (AlN). The transition layer is used to facilitate gradual the step-wise changes of the lattice structure and the coefficient of thermal expansion between the semiconductor layer 106 and the overlying layer (e.g. the buffer layer 108). In some embodiments, the transition layer includes a graded aluminum gallium nitride layer ($Al_xGa_{1-x}N$), wherein X is the aluminum content ratio in the aluminum gallium constituent, and X is in a range from 0 to 1. In some embodiments, the graded aluminum gallium nitride layer includes multilayer structure, wherein each layer has a decreased X ratio (from a bottom layer adjoining the nucleation layer to a top layer adjoining the buffer layer 108). In some embodiments, the graded aluminum gallium nitride layer has a continuous gradient of the X ratio. The nucleation layer and the transition layer may be formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process. For the purpose of simplicity and clarity, the nucleation layer and the transition layer will not be shown in figures.

Thereafter, refer again to FIG. 1. A channel layer 110 is formed over the buffer layer 108, in accordance with the embodiment of the disclosure. The channel layer 110 has a resistivity lower than the buffer layer 108, for improving the current performance of HEMT 100 device. In some embodiments, the channel layer 110 includes one or more Group III-V compound layers. Examples of Group III-V compound layers include, but are not limited to, GaN, AlGaN, InGaN and InAlGaN. In some embodiments, the channel layer 110 includes alternatingly arranged p-doped and n-doped Group III-V compound layers. In some embodiments, the channel layer 110 includes a p-doped GaN layer. Examples of the p-type dopant in the p-doped GaN layer include, but are not limited to, carbon (C), iron (Fe), magnesium (Mg) and zinc (Zn). Alternatively, the channel layer 110 may include an un-doped GaN layer. In some embodiments, the channel layer 110 is formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process.

Thereafter, as shown in FIG. 1, a barrier layer 112 is formed over the channel layer 110, in accordance with some embodiments of the disclosure. The barrier layer 112 is configured to cause a two dimensional electron gas (2DEG) 114 to be formed in the channel layer 110 along an interface between the channel layer 110 and the barrier layer 112. A heterojunction is formed between the barrier layer 112 and the channel layer 110. A band gap discontinuity exists between the barrier layer 112 and the channel layer 110. In some embodiments, the band gap of the barrier layer 112 is greater than the band gap of the channel layer 110, thereby creating a thin layer of highly mobile conducting electrons, i.e., the two dimensional electron gas 114 in the channel layer 110, adjacent the interface with the barrier layer 112. The electrons in the two dimensional electron gas 114 are charge carriers in the channel layer 110.

Due to the naturally occurring two dimensional electron gas 114 without gate structure, the HEMT 100 would be conductive without the application of a voltage to the gate electrode. Therefore, the HEMT 100 would be a normally-ON device in a negative threshold voltage. Such a normally-ON state is a design concern in power applications where it is desirable to prevent, or substantially inhibit, the current from flowing in or through the HEMT 100. In some embodiments, in order to convert a normally-ON HEMT device to a normally-OFF HEMT device, a gate structure is configured over the barrier layer 112 to deplete the two dimensional electron gas 114 under the gate structure. The details will be described in later embodiments.

In some embodiments, the barrier layer 112 includes one or more Group III-V compound layers which are different in composition from the Group III-V compound layers of the channel layer 110. Examples of these materials include aluminum nitride (AlN), graded aluminum gallium nitride ($Al_yGa_{(1-y)}N$) (wherein y is the aluminum content ratio in AlGaN, and y is in a range from 0 to 1), or a combination thereof. In some embodiments, the barrier layer 112 is formed by an epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process.

Figure 2:
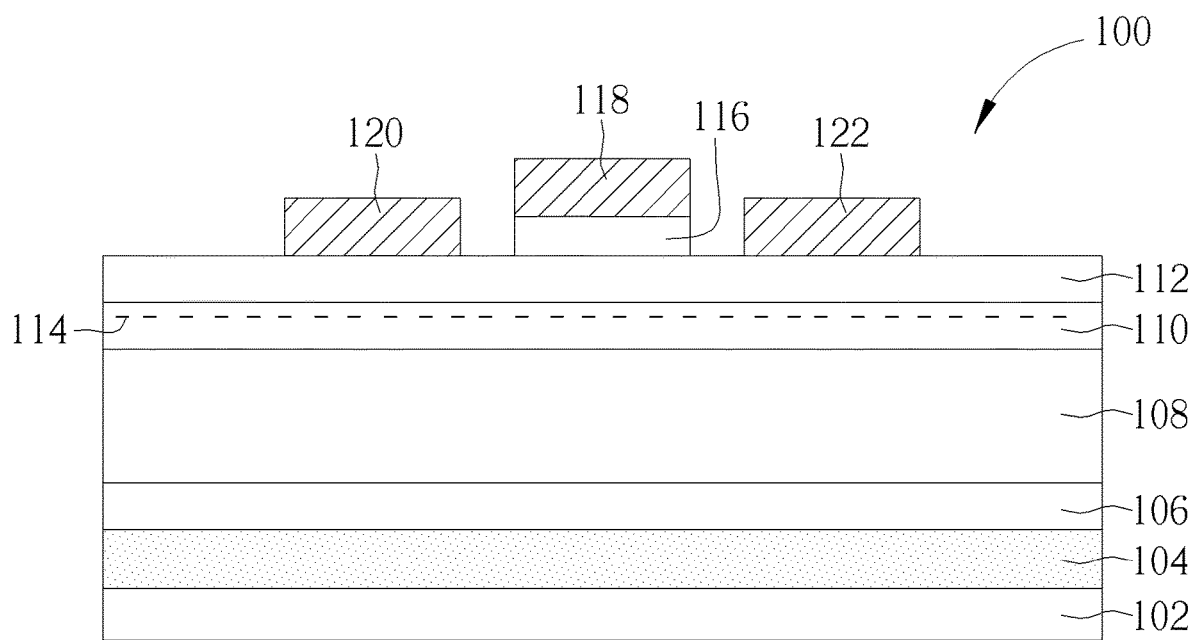

Thereafter, as shown in FIG. 2, a p-doped gallium nitride (p-GaN) layer 116 is formed over the barrier layer 112, in accordance with some embodiments of the disclosure. In some embodiments, the p-GaN layer 116 has a constant concentration. Examples of the p-type dopant in the p-doped GaN layer 116 includes, but are not limited to, carbon (C), iron (Fe), magnesium (Mg) and zinc (Zn). In some embodiments, the p-GaN layer 116 may be formed by a epitaxial growth process. Examples of epitaxial growth processes include, but are not limited to, a metal-organic chemical vapor deposition (MOCVD) process, a molecular beam epitaxy (MBE) process, and a hydride vapor phase epitaxy (HVPE) process. In other embodiment, the p-GaN layer 116 may be replaced with a p-AlGaN layer. Other additional p-GaN layers with different doping concentration may also be formed over the p-GaN layer 116 to increase the gate operation voltage of HEMT 100.

The operations for forming the buffer layer 108, the channel layer 110, the barrier layer 112 and the p-GaN layer 116 may be in-situ performed in the same process chamber without removing to another chamber, thereby saving cost and reducing pollution.

Refer again to FIG. 2. After the p-GaN layer 116 is formed, a gate electrode 118 is formed over the p-GaN layer 116. In some embodiments, gate electrode 118 includes a conductive material layer that includes a refractory metal or the respective compounds including, e.g., titanium (Ti), titanium nitride (TiN), titanium tungsten (TiW), and tungsten (W). Alternatively, the gate electrode 118 includes nickel (Ni), gold (Au), copper (Cu), or the alloys thereof. The gate electrode 118 and the p-GaN layer 116 may be patterned through photolithographic and etching processes, and a gate dielectric layer or a dielectric passivation layer may be formed therebetween to increase the threshold voltage of HEMT 100. For the purpose of simplicity and clarity of description and drawing, the gate dielectric layer, the dielectric passivation layer and relevant processes would not be shown in the figures.

Thereafter, as shown in FIG. 2, a source 120 and a drain 122 are formed respectively at two sides of the gate electrode 118 on the barrier layer 112. Therefore, the gate electrode 118, source 120, drain 122 and the carrier channel layer 110 form collectively the HEMT 100 structure. When a voltage is applied to gate electrode 118, the device current may be modulated. In some embodiments, source 120 and drain 122 may include one or more conductive materials, for example, Ti, Co, Ni, W, Pt, Ta, Pd, Mo, TiN, an AlCu alloy, and alloys thereof. The gate electrode 118, the source 12 and the drain 122 may be formed separately or simultaneously by deposition process and photolithographic and etch processes. The deposition process includes a chemical vapor deposition (CVD), a physical vapor deposition (PVD), an atomic layer deposition (ALD), a high density plasma CVD (HDPCVD), a metal organic CVD (MOCVD), a plasma enhanced CVD (PECVD), or other applicable processes.

Figure 3:
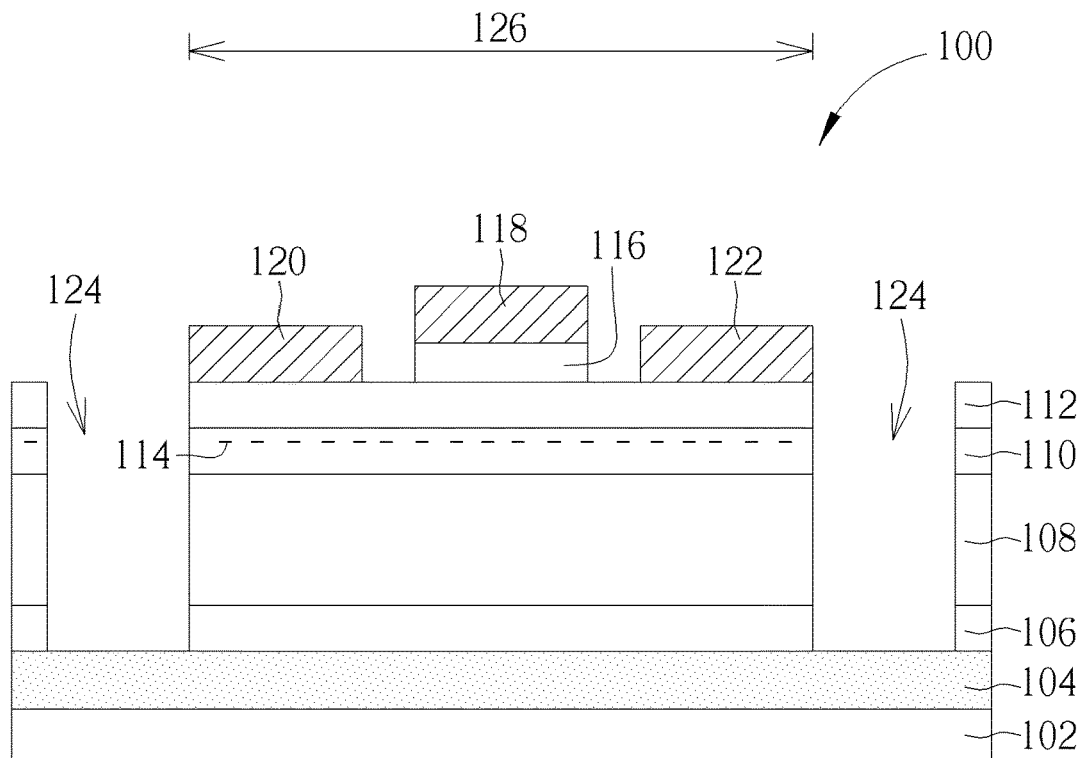

Please refer to FIG. 3. After the gate electrode 118, source 120 and drain 122 are formed, a trench 124 is formed surrounding the HEMT 100. In the embodiment of present invention, the trench 124 would define the active area in every HEMT 100. The trench 124 may be formed by using anisotropic etch process to etch through barrier layer 112, channel layer 110, buffer layer 108 and semiconductor layer 106 and stop at insulating layer 104 with the insulating layer 104 functions as an etch stop layer. In the embodiment of present invention, the dimension of active areas in various parts of the HEMT 100 would affect the threshold voltage of the device, which will be explained in later embodiments. Please note that, although the trench 124 in the figure is adjacent to source 120 and drain 122, the trench 124 may be separated from source 120 and drain 122 at a distance in other embodiments.

Figure 4:
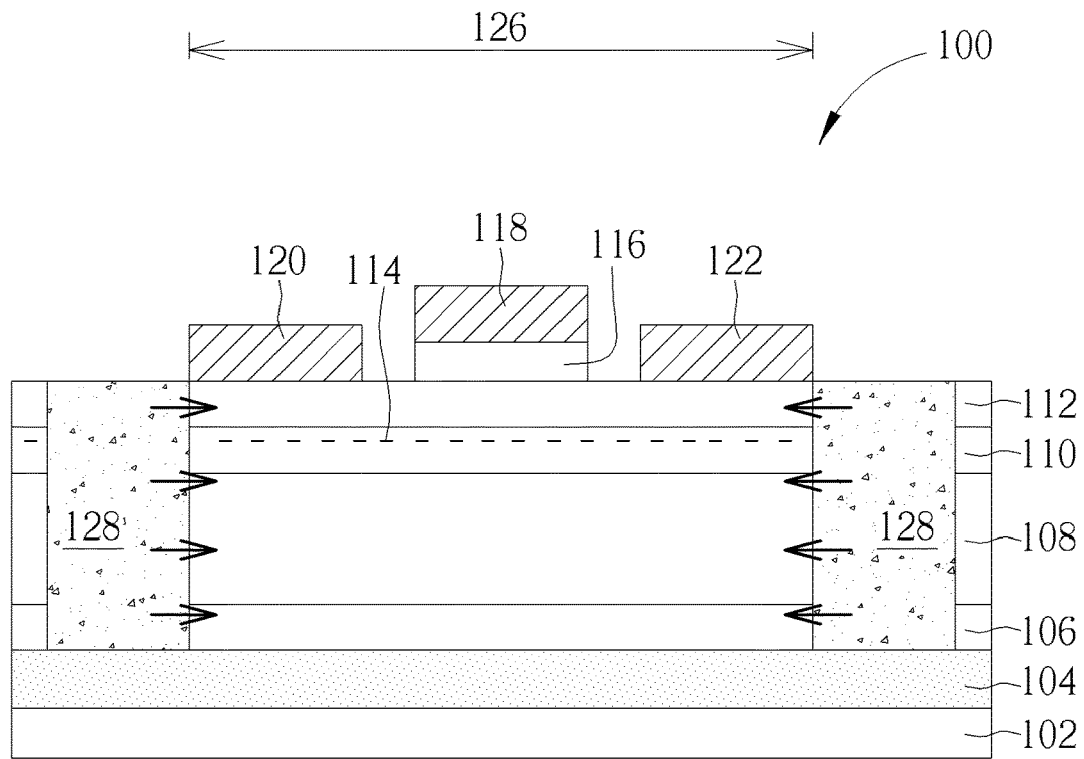

Thereafter, as shown in FIG. 4 in accordance with the embodiment of the disclosure, a trench isolation structure 128 is formed in trench 124. The trench isolation structure 128 fills up entire trench 124 and connects downward to the underlying insulating layer 104, so that entire HEMT 100 is isolated by surrounding trench isolation structure 128 and underlying insulating layer 104, and the problems like cross-talk between transistors and backgating effect may be solved efficiently. More particularly, in the embodiment of the disclosure, the trench isolation structure 128 is designed to be adjacent to and surrounds the channel layer 110 and the barrier layer 112 of HEMT 100. In this way, the trench isolation structure 128 may apply stress on channel layer 110 and barrier layer 112 to modify the two dimensional electron gas therebetween, thereby further controlling the threshold voltage of the transistor. The principle of voltage modification is that the concentration of two dimensional electron gas may be modified by changing total polarization vector of piezoelectric components in the barrier layer 112, thereby further modifying the current flowing through the transistor, and the threshold voltage of the transistor may be, therefore, modified.

In the example of n-type HEMT 100, the current flowing through the transistor may be decreased by applying compressive stress on channel layer 110 and barrier layer 112 to reduce the concentration of two dimensional electron gas therebetween, thereby achieving the effect of a normally-OFF transistor. On the other hand, in the example of p-type HEMT, two dimension hole gas (2DHG) is the carrier channel of p-type HEMT. Accordingly, the current flowing through the transistor may be decreased by applying tensile stress on channel layer 110 to reduce the concentration of two dimensional hole gas, thereby achieving the effect of a normally-OFF transistor.

In the embodiment of present invention, the material of trench isolation structure 128 would decide the stress applied on the HEMT 100 is compressive or tensile. In this regard, silicon nitride is an excellent material. Since the cell parameter of silicon nitride is different from the one of elementary silicon, the grown silicon nitride film may generate tensile stress or compressive stress based on its deposition method, especially when using plasma enhanced CVD that the deposition parameter may be adjusted to determine whether it is compressive stress or tensile stress applied on the AlGaN layer.

In other embodiment, the aforementioned trench isolation structure 128 may be formed before gate electrode 118, source 120 and drain 122, depending on the actual process requirement or design.

Figure 5:
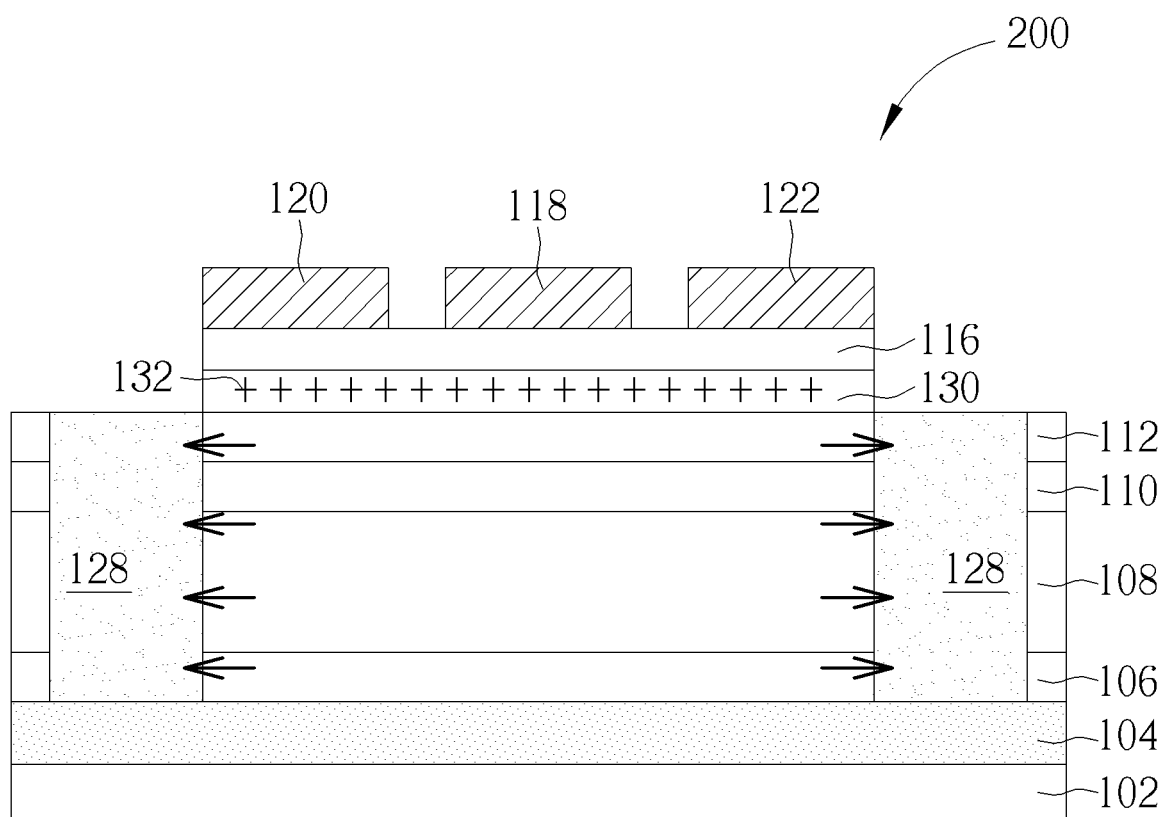
FIG. 5 is a schematic cross-section illustrating the structure of a p-type high electron mobility transistor in accordance with the preferred embodiment of present invention.

Please refer now to FIG. 5, which is a schematic cross-section illustrating a p-type HEMT 200 in accordance with the embodiment of the present invention. In the embodiment of the present invention, the structure of p-type HEMT 200 is similar to the aforementioned n-type HEMT 100. The difference therebetween lies in an additional unintentionally doped (UID) GaN layer 130 that is formed between p-doped GaN layer 116 and barrier layer 112 in the p-type HEMT 200. With this design, a two dimension hole gas 132 is generated at the interface between the unintentionally doped GaN layer 130 and the barrier layer 112. For the p-type HEMT 200 using two dimension hole gas 132 as a carrier channel, the current flowing through the transistor may be decreased by forming trench isolation structure 128 capable of applying tensile stress to reduce the concentration of two dimension hole gas 132, thereby achieving the effect of a normally-OFF transistor.

Variations of active areas in n-type and p-type HEMTs will be explained hereinbelow in following embodiment. FIGS. 6-11 are schematic plan views illustrating n-type and p-type HEMTs matching trench isolation structures with different stress property. In actual implementation, these various matching approaches may be utilized to achieve desired effect of modifying (increasing or decreasing) the threshold voltage of transistors. Please note that all following embodiments are implemented based on the assumption that the gate electrode 118, the source 120 and the drain 122 have same area.

Figure 6:
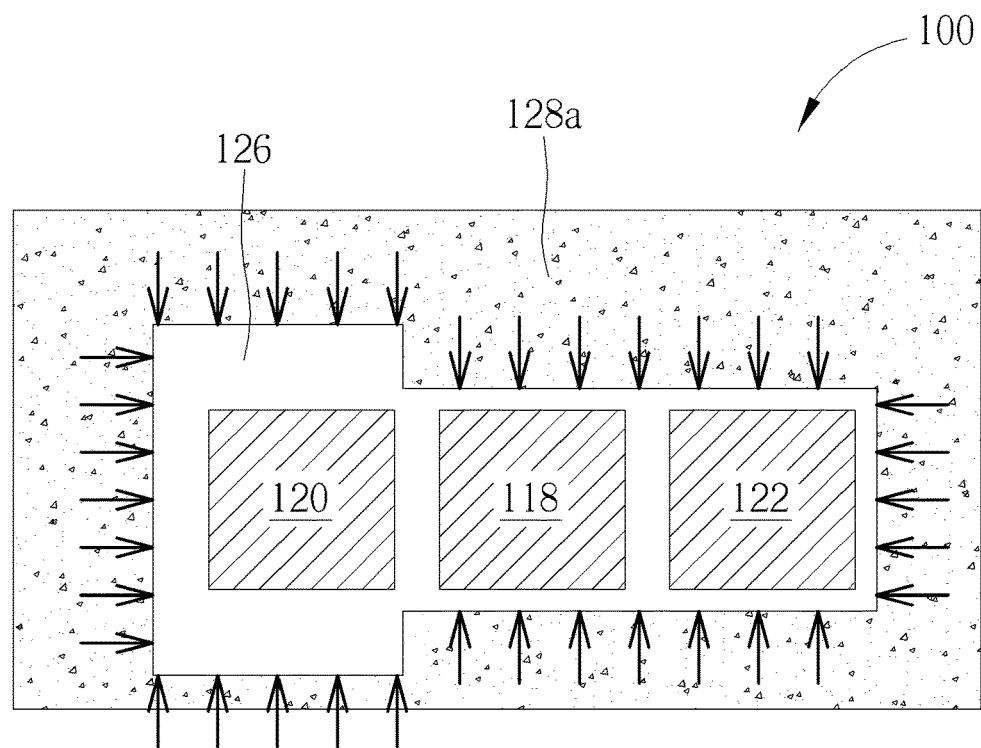
FIGS. 6-11 are schematic plan views illustrating n-type high electron mobility transistors and p-type high electron mobility transistors matching the trench isolation structures with different stress property.

First, please refer to FIG. 6. In the condition that n-type HEMT 100 matching the trench isolation structure 128a with compressive stress, the area of active area 126 at source 120 may be designed to be larger than the area of active area 126 at gate electrode 118 or at drain 122. In this way, since the trench isolation structure 128a providing compressive stress is farther from the source 120, the compressive stress taken by the source 120 would be smaller than the compressive stress taken by the gate electrode 118 or drain 122, so that the concentration of two dimension electron gas at source 120 would be greater than the one at drain 122. The current flowing through the transistor is thereby increased.

Figure 7:
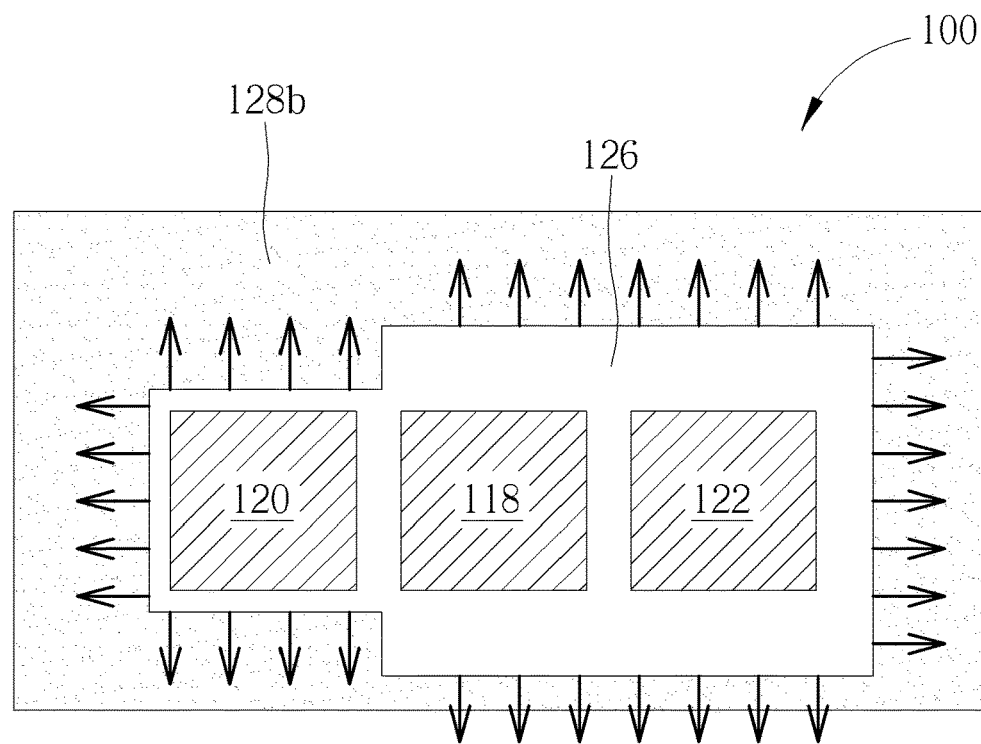

On the other hand, in the condition that n-type HEMT 100 matching the trench isolation structure 128b with tensile stress, as shown in FIG. 7, the area of active area 126 at source 120 may be designed to be smaller than the area of active area 126 at gate electrode 118 or at drain 122. In this way, since the trench isolation structure 128b providing tensile stress is relatively close to the source 120, the tensile stress taken by the source 120 would be larger than the tensile stress taken by the gate electrode 118 or drain 122, so that the concentration of two dimension electron gas at source 120 would be greater than the one at drain 122. The current flowing through the transistor is thereby increased.

Figure 8:
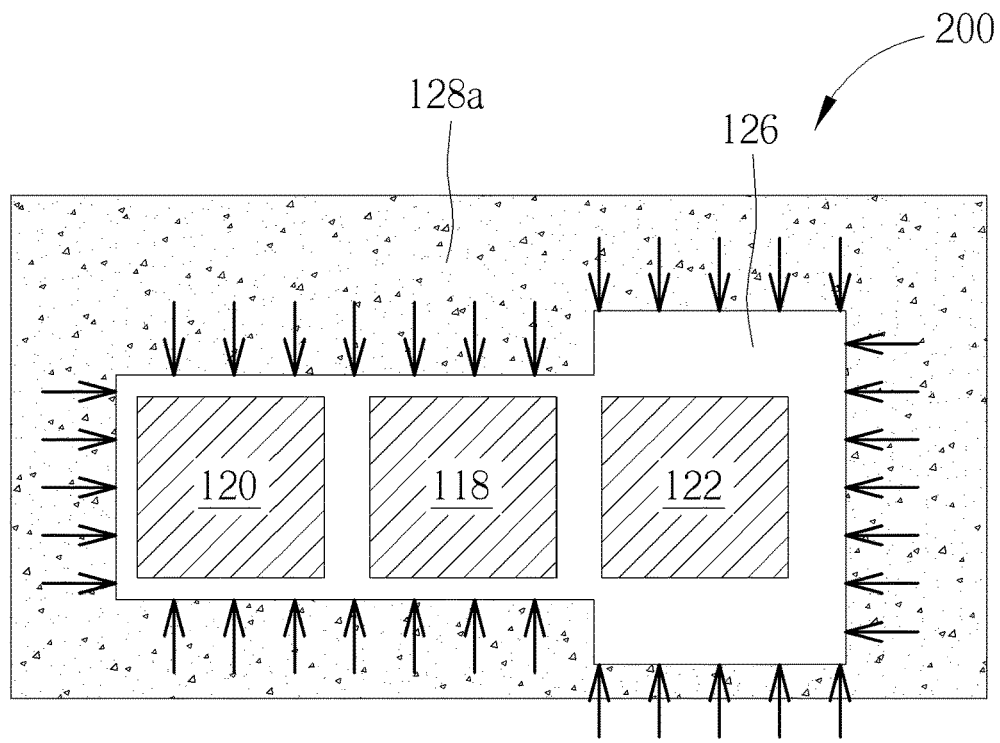

Regarding p-type HEMT 200, please refer to FIG. 8. In the condition that trench isolation structure 128a provides compressive stress, the area of active area 126 at source 120 may be designed to be smaller than the area of active area 126 at gate electrode 118 or at drain 122. In this way, since the trench isolation structure 128a providing compressive stress is relatively close to the source 120, the compressive stress taken by the source 120 would be larger than the compressive stress taken by the gate electrode 118 or drain 122, so that the concentration of two dimension hole gas at source 120 would be greater than the one at drain 122. The current flowing through the transistor is thereby increased.

Figure 9:
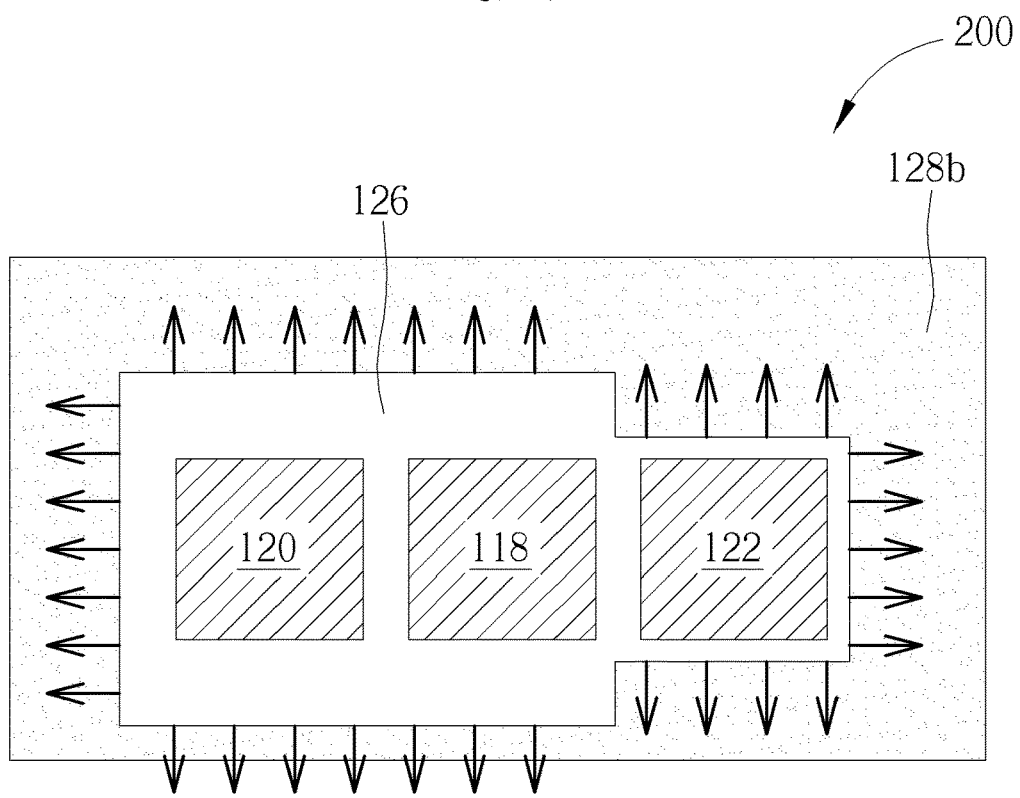
Figure 10:
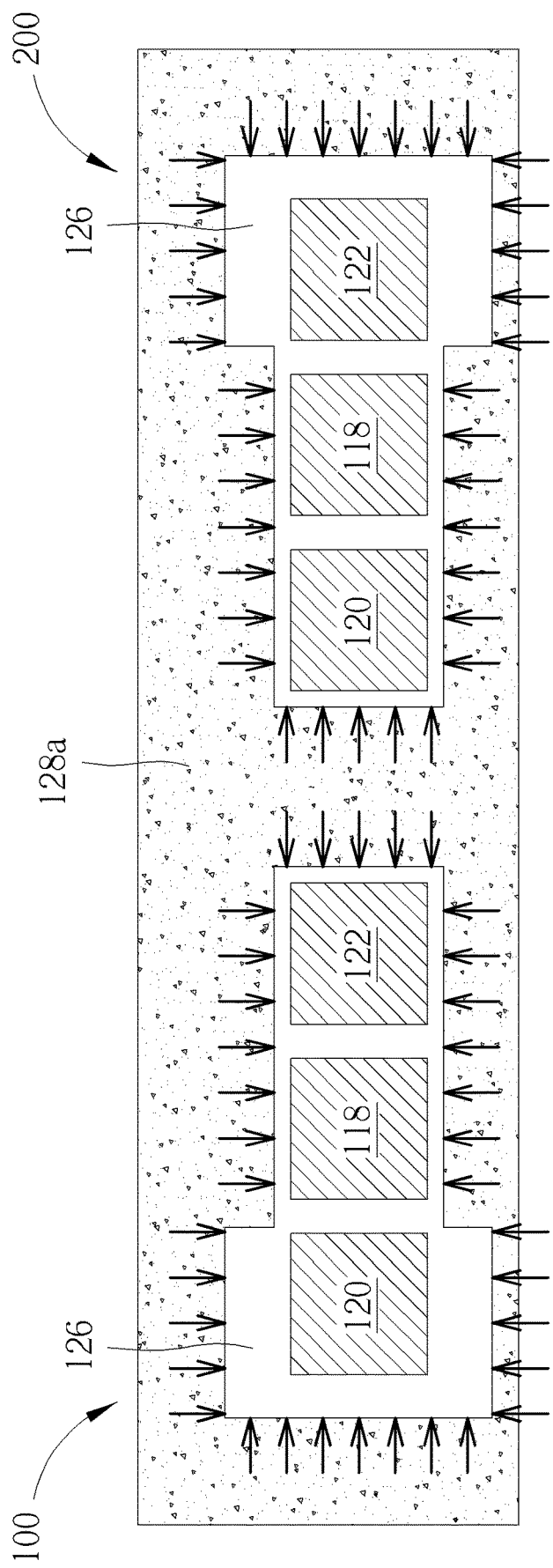
Figure 11:
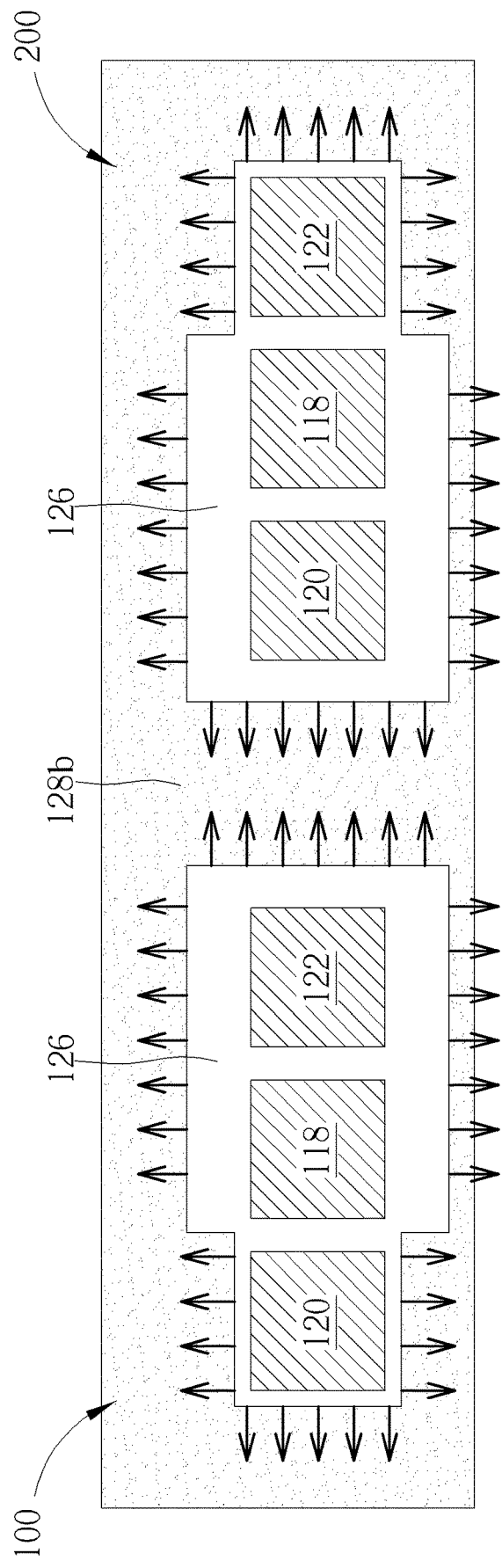

On the other hand, in the condition that p-type HEMT 200 matching the trench isolation structure 128b with tensile stress, as shown in FIG. 9, the area of active area 126 at source 120 may be designed to be smaller than the area of active area 126 at gate electrode 118 or at drain 122. In this way, since the trench isolation structure 128b providing tensile stress is farther from the source 120, the tensile stress taken by the source 120 would be smaller than the tensile stress taken by the gate electrode 118 or drain 122, so that the concentration of two dimension hole gas at source 120 would be greater than the one at drain 122. The current flowing through the transistor is thereby increased.

In other embodiment, different stresses may be simultaneously applied on the source 120 and the gate electrode 118 and drain 122 of single transistor to achieve desired effect. For example, by forming trench isolation structures capable of providing tensile stress and compressive stress respectively at source 120 and at gate 118 or source 120, the effect of increasing current through the transistor may be further improved.

In the present invention, the aforementioned embodiments may be applied in combination. Please refer to FIG. 10. In the condition that trench isolation structure 128a provides compressive stress, n-type HEMT 100 and p-type HEMT 200 may be disposed simultaneously in the trench isolation structure 128a, wherein the area of active area 126 at source 120 of the n-type HEMT 100 may be designed to be larger than the area of active area 126 at gate electrode 118 or at drain 122 of the n-type HEMT 100, while the area of active area 126 at source 120 of the p-type HEMT 200 may be designed to be smaller than the area of active area 126 at gate electrode 118 or at drain 122 of the p-type HEMT 200. This design may make both currents flowing through the n-type HEMT 100 and the p-type HEMT 200 increase.

On the other hand, In the condition that trench isolation structure 128b provides tensile stress, n-type HEMT 100 and p-type HEMT 200 may be disposed simultaneously in the trench isolation structure 128b, wherein the area of active area 126 at source 120 of the n-type HEMT 100 may be designed to be smaller than the area of active area 126 at gate electrode 118 or at drain 122 of the n-type HEMT 100, while the area of active area 126 at source 120 of the p-type HEMT 200 may be designed to be larger than the area of active area 126 at gate electrode 118 or at drain 122 of the p-type HEMT 200. This design may make both currents flowing through the n-type HEMT 100 and the p-type HEMT 200 increase.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating high electron mobility transistor, comprising:
    providing a substrate with active areas;
    forming a buffer layer, a channel layer and a barrier layer sequentially on said substrate, and forming gate, source and drain on said barrier layer;
    forming a trench surrounding said channel layer and said barrier layer; and
    forming a trench isolation structure in said trench, wherein said trench isolation structure applies stress on said channel layer and said barrier layer and modify two-dimension electron gas (2DEG) or two-dimension hole gas (2DHG) of said high electron mobility transistor, wherein said high electron mobility transistor is n-type high electron mobility transistor, and said stress applied by said trench isolation structure is compressive stress, and an area of said active area at said source is larger than an area of said active area at said gate and is larger than an area of said active area at said drain.

2. A method of fabricating high electron mobility transistor, comprising:
    providing a substrate with active areas;
    forming a buffer layer, a channel layer and a barrier layer sequentially on said substrate, and forming gate, source and drain on said barrier layer;
    forming a trench surrounding said channel layer and said barrier layer; and
    forming a trench isolation structure in said trench, wherein said trench isolation structure applies stress on said channel layer and said barrier layer and modify two-dimension electron gas (2DEG) or two-dimension hole gas (2DHG) of said high electron mobility transistor, wherein said high electron mobility transistor is n-type high electron mobility transistor, and said stress applied by said trench isolation structure is tensile stress, and an area of said active area at said source is smaller than an area of said active area at said gate and is smaller than an area of said active area at said drain.

3. A method of fabricating high electron mobility transistor, comprising:
    providing a substrate with active areas;
    forming a buffer layer, a channel layer and a barrier layer sequentially on said substrate, and forming gate, source and drain on said barrier layer;
    forming a trench surrounding said channel layer and said barrier layer; and
    forming a trench isolation structure in said trench, wherein said trench isolation structure applies stress on said channel layer and said barrier layer and modify two-dimension electron gas (2DEG) or two-dimension hole gas (2DHG) of said high electron mobility transistor, wherein said high electron mobility transistor is p-type high electron mobility transistor, and said stress applied by said trench isolation structure is tensile stress, and an area of said active area at said source is larger than an area of said active area at said gate and is larger than an area of said active area at said drain.

4. A method of fabricating high electron mobility transistor, comprising:
    providing a substrate with active areas;
    forming a buffer layer, a channel layer and a barrier layer sequentially on said substrate, and forming gate, source and drain on said barrier layer;
    forming a trench surrounding said channel layer and said barrier layer; and
    forming a trench isolation structure in said trench, wherein said trench isolation structure applies stress on said channel layer and said barrier layer and modify two-dimension electron gas (2DEG) or two-dimension hole gas (2DHG) of said high electron mobility transistor, wherein said high electron mobility transistor is p-type high electron mobility transistor, and said stress applied by said trench isolation structure is compressive stress, and an area of said active area at said source is smaller than an area of said active area at said gate and is smaller than an area of said active area at said drain.

5. The method of fabricating high electron mobility transistor of claim 1, wherein the material of said buffer layer is aluminum nitride (AlN) and gallium nitride (GaN), and the material of said channel layer is gallium nitride (GaN), and the material of said barrier layer is aluminum gallium nitride (AlGaN), and the material of said trench isolation is silicon nitride.

6. The method of fabricating high electron mobility transistor of claim 1, wherein said trench isolation structure is further adjacent and surrounds said active area and connects downward to an insulating layer under said active area.

* * * * *